United States Patent
Penney et al.

(10) Patent No.: US 11,315,622 B2
(45) Date of Patent: Apr. 26, 2022

(54) DDR5 FOUR-PHASE GENERATOR WITH IMPROVED METASTABILITY RESISTANCE

(71) Applicant: Micron Technology, Inc., Boise, ID (US)

(72) Inventors: Daniel B. Penney, Wylie, TX (US); Parthasarathy Gajapathy, McKinney, TX (US); Brian J. Ladner, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 16/834,144

(22) Filed: Mar. 30, 2020

(65) Prior Publication Data

US 2021/0304808 A1    Sep. 30, 2021

(51) Int. Cl.
| | |
|---|---|
| *G11C 11/4076* | (2006.01) |
| *H03K 3/037* | (2006.01) |
| *G11C 11/4091* | (2006.01) |
| *G11C 7/10* | (2006.01) |
| *G11C 11/4093* | (2006.01) |

(52) U.S. Cl.
CPC .......... *G11C 11/4076* (2013.01); *G11C 7/106* (2013.01); *G11C 7/1072* (2013.01); *G11C 7/1087* (2013.01); *G11C 7/1093* (2013.01); *G11C 11/4091* (2013.01); *H03K 3/0375* (2013.01); *G11C 11/4093* (2013.01); *G11C 2207/2254* (2013.01)

(58) Field of Classification Search
CPC ............ G11C 11/4076; G11C 11/4091; G11C 7/1087; G11C 7/1093; G11C 2207/2254; G11C 11/4093; H03K 3/0375
See application file for complete search history.

(56) References Cited

U.S. PATENT DOCUMENTS

| | | | |
|---|---|---|---|
| 10,256,795 B1 | 4/2019 | Penney | |
| 10,283,188 B1 * | 5/2019 | Penney | ................ G11C 7/1093 |
| 10,332,575 B2 | 6/2019 | Penney | |
| 10,339,997 B1 | 7/2019 | Penney | |
| 2019/0198084 A1 * | 6/2019 | Penney | ............... G11C 11/4087 |
| 2019/0304532 A1 | 10/2019 | Kitagawa et al. | |
| 2020/0051603 A1 * | 2/2020 | Kitagawa | ............. G11C 7/1096 |

* cited by examiner

*Primary Examiner* — Mushfique Siddique
(74) *Attorney, Agent, or Firm* — Fletcher Yoder, P.C.

(57) ABSTRACT

A multi-phase clock generator has a set of transistors, a first latch, and a second latch. The set of transistors may be arranged in a sense amplifier latch architecture, in which the set of transistors include a first inverter and a second inverter. The first inverter may provide a first phase data strobe signal and the second inverter may provide a second phase data strobe signal. The first latch and the second latch are coupled to the set of transistors. The set of transistors may receive a first portion of current at the first inverter and a second portion of current at the second inverter. The set of transistors may amplify the first portion of current in response to the first portion being greater than the second portion. The set of transistors may also drive the first phase data strobe signal using the amplified first portion.

20 Claims, 9 Drawing Sheets

DDR5 FOUR-PHASE GENERATOR WITH IMPROVED METASTABILITY RESISTANCE

BACKGROUND

1. Field of the Invention

The present disclosure relates to the field of semiconductor devices, and more specifically, to methods that mitigate metastability effects in a multi-phase clock signal.

2. Description of the Related Art

Random access memory (RAM) devices, such as the ones used in electronic devices to facilitate data processing and to provide storage, may provide direct access to addressable data storage cells that form the memory circuitry of the device. Certain RAM devices, such as dynamic RAM (DRAM) devices may, for example, have multiple memory banks having many addressable memory elements. The RAM devices may also have a command interface that may receive addresses and instructions (e.g., read, write, etc.) for operations that may be associated with those addresses. The RAM devices may also include decoding circuitry that may translate the instructions and the addresses into internal commands for accessing the corresponding memory banks.

The data exchanged between the processing circuitry (e.g., host) of an electronic device and the memory device may be accompanied by synchronizing clock signals. As an example, during a write process, the electronic device may provide write commands and addresses that are synchronized with a clock signal while also providing data to be stored using the write command that is synchronized with a data strobe signal. That is, the RAM devices may coordinate both the write command synchronized to a clock signal and the data synchronized to the data strobe signal to perform the write operations.

The RAM device may perform multiple memory operations that include reading or writing data at various speeds. Some of these memory operations may include receiving or transmitting the data at high speeds synchronized to a relatively high data strobe clock frequency while other memory operations may include receiving or transmitting the data at low speeds synchronized to a relatively low data strobe clock frequency. As such, the data strobe clock signal may change frequencies to implement these memory operations that read or write data at different speeds. In some instance, the data strobe clock signal may be divided into multiple data strobe clocks signals (e.g., a multi-phase data strobe signal) with different phases and frequencies. However, the data strobe clock signal may be in an undefined or unknown logic state prior to being divided into the different phases. As such, subsequent circuitry or operations performed using the multi-phase data strobe signal may cause metastability or uncertainty in logic circuitry that processes the data strobe clock signals in the RAM device.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems may use random access memory (RAM) devices that are coupled to processing circuitry (e.g., host) and may provide storage of data for processing. Examples of RAM devices include dynamic RAM (DRAM) devices and synchronous DRAM (SDRAM) devices, which may store individual bits electronically. The stored bits may be organized into addressable memory elements (e.g., words), which may be directly accessed by the processing circuitry. Memory devices may also include command circuitry to receive instructions and/or addresses from the processing circuitry. For example, in double data rate type five (DDR5) SDRAM devices, these instructions and/or addresses may be provided by the processing circuitry by a 14-bit command/address (CA) signal. Moreover, the processing circuitry may also provide clocking signals to the memory device along with the instructions and/or addresses. For example, the CA signal may be synchronized to a clock signal (Clk). In many memory devices, such as in the DDR5 SDRAM devices, processing circuitry may provide the clocking signal (Clk) through a differential clock signal pair (Clk_t and Clk_c) to provide information to the DDR5 SDRAM device indicating when an instruction and/or an address signal is ready to be processed.

In some instances, such as during a write operation, the processing circuitry may also provide data using a data bus (DQ), which may be synchronized with a data strobe (DQS) signal (e.g., strobe clock signal) that facilitates capture of data in the data (DQ) bus by the memory device. The data strobe (DQS) signal may provide information to the memory device as to when the data (e.g., bits) is available. By way of example, the processing circuitry may provide a clocking signal and instructions to a DDR5 SDRAM device to indicate that a command/address signal (CA) may be available (e.g., stable, ready) for processing during a transition (e.g., edge) of the clocking signal (Clk). If the available command/address signal (CA) is a write command, the processing circuitry may, after a pre-determined time, provide data in a data bus (DQ) along with the data strobe (DQS) signal to indicate that the data in the data bus (DQ) is ready to be stored.

As previously discussed, the external data strobe (DQS) signal may be divided into multiple phases (e.g., 4) to produce an internal data strobe signal used by the memory device to perform memory operations occurring at different frequencies. The data strobe (DQS) signal may be received as a differential pair (e.g., DQS_t and DQS_c). In some instances, the state of either of the data strobe differential pair clocking signals may be unknown or undefined when a command, such as a write command, is entered.

Briefly, the data strobe (DQS) signal may be a bidirectional data line in which the data strobe (DQS) signal may be sent to the memory device during a write operation but may be inactive during other periods. In periods in which the data strobe (DQS) signal is inactive, input circuitry of the memory device responsible for processing the data strobe (DQS) signal may enter an indeterminate state (e.g., metastability). That is, flip-flops and/or latches in the input circuitry that employs both the clock (CLK) signal and the data strobe (DQS) signal for performing the write operation, may enter an indeterminate or inconsistent state. In some instances, either or both of the data strobe differential pair clocking signals may also be in an undefined state prior to a write burst preamble, such as due to the inactive period. The preamble may refer to a time period in which the data strobe (DQS) signal for writing data from the data bus (DQ) is delayed. In other instances, the data strobe differential pair clocking signals may rise (e.g., logic 1) or fall (e.g., logic 0) at the same or approximately the same time, causing an insufficient differential split. The insufficient differential split may result in an indeterminate output from a differential buffer receiving the data strobe differential pair clocking signals, causing metastability in circuitry components using the output. Since the differential pair clocking signals and/or their outputs may be in an undefined or indeterminate state, subsequent circuitry or signals generated based on the clocking signals may also be in an undefined or indeterminate state. For example, internal clocking signals generated from the external data strobe (DQS) signal that may be used for latches, flip-flops, and/or registers in the input circuitry data path capturing the data bus (DQ) value or data bits may be in a metastable (e.g., inconsistent, unknown, undesired) state and as a result, provide inaccurate or erroneous data.

To address metastability, an internal feedback path for memory device components, such as a clock phase generator that provides internal data strobe clock signals, may be amplified and/or capacitive loads on the internal feedback path may be reduced. Embodiments described herein relate to methods and systems that may mitigate metastability in input circuitry by amplifying feedback and using complementary outputs in a sense amplifier-type architecture of the clock phase generator. It should be noted that, while the embodiments described are related to memory circuitry, the methods and systems may be employed more generally in input circuitry where metastability may affect the performance.

Figure 1:
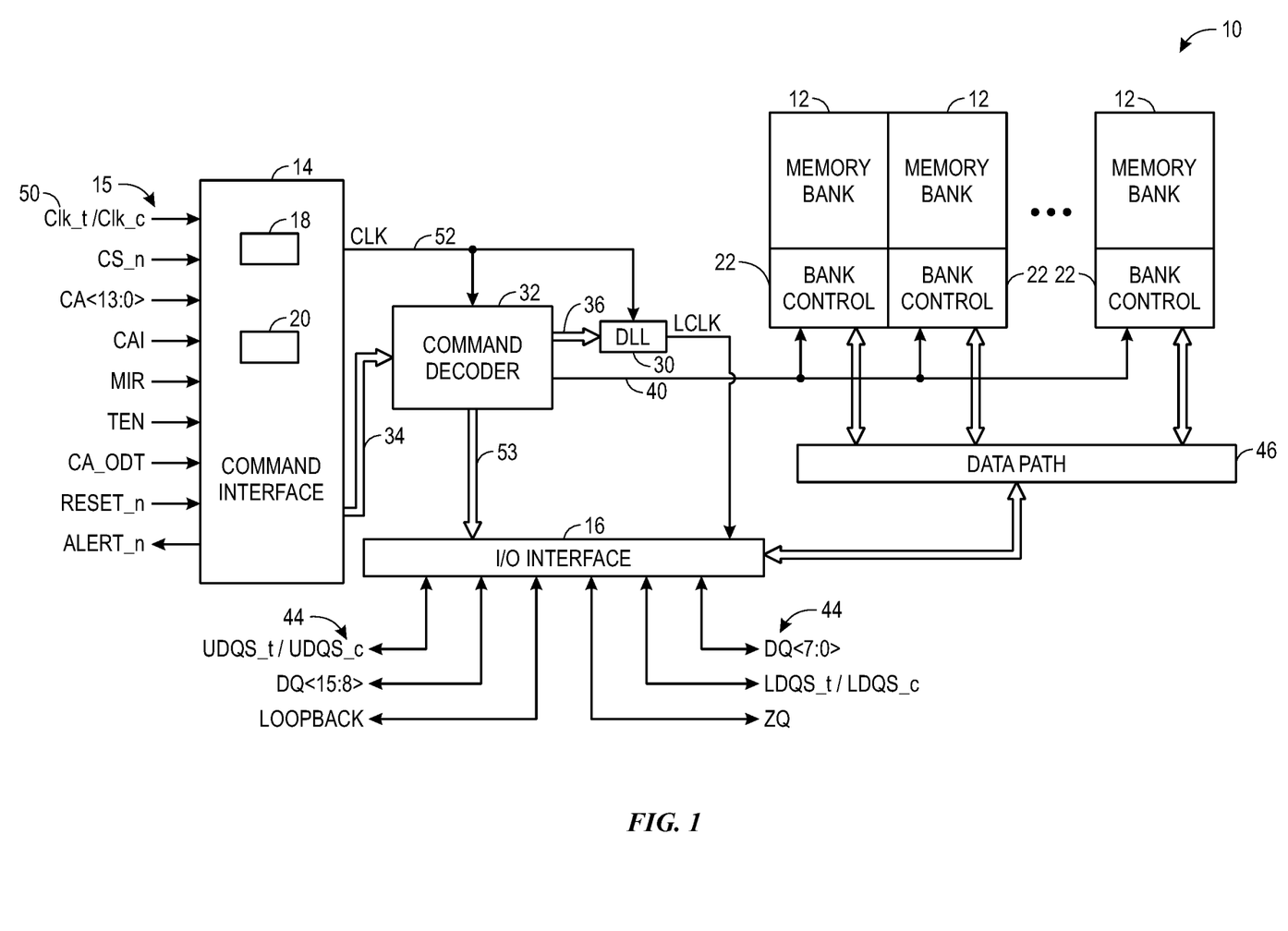
FIG. 1 is a block diagram illustrating an organization of a memory device that may benefit from a metastable resistant multi-phase generator to mitigate metastability, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include sixteen memory banks 12, arranged into eight bank groups, each bank group including two memory banks. Similarly, for a 16 Gb DDR5 SDRAM, the memory chip may include thirty-two memory banks 12, arranged into eight bank groups, each bank group including four memory banks. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a various number of signals such as signals 15, from an external device or host (not shown), such as a processor or controller. The processor or controller may provide the various signals 15 to the memory device 10 to facilitate the transmission and reception of data to be written to and/or read from the memory device 10. In some embodiments, the command interface 14 may include a number of circuits, such as a clock input circuit 18 and a command/address (CA) input circuit 20, to ensure proper handling of the signals 15. The command interface 14 may receive one or more clock signals from the external device. Generally, the double data rate (DDR) memory utilizes a differential pair of system clock signals, referred to herein as the true clock signal (Clk_t) and the complementary clock signal (Clk_c) 50. The positive clock edge for DDR refers to the point where the rising true clock signal Clk_t crosses the falling complementary clock signal Clk_c, while the negative clock edge indicates the falling true clock signal Clk_t and the rising of the complementary clock signal Clk_c. Commands (e.g., read command, write command, etc.) are often entered on the positive edges of a clock signal, and data is transmitted or received on both the positive and negative clock edges.

The clock input circuit 18 may receive the differential pair of clock signals 50 to generate an internal clock signal (CLK) 52. The internal clock signal (CLK) 52 is supplied to an internal clock generator 30, such as a delay locked loop (DLL) circuit. The internal clock generator 30 generates a phase controlled internal clock signal (LCLK) based on the received internal clock signal (CLK) 52. The phase controlled internal clock signal (LCLK) is supplied to the I/O interface 16, for instance, and is used as a timing signal for determining an output timing of read data or capture window for write data.

The internal clock signal (CLK) 52 may also be provided to various other components within the memory device 10 and may be used to generate various additional internal clock signals. For instance, the internal clock signal (CLK) 52 may be provided to a command decoder 32. The command decoder 32 may receive command signals from a command bus 34 and may decode the command signals to provide various internal commands. For instance, the command decoder 32 may provide command signals to the internal clock generator 30 over a bus 36 to coordinate generation of the phase controlled internal clock signal (LCLK). The phase controlled internal clock signal (LCLK) may be used to clock data through the I/O interface 16.

Furthermore, the command decoder 32 may decode commands, such as read commands, write commands, mode-register set commands, and/or activate commands, and provide instructions to the I/O interface 16 via I/O bus 53 to regulate the flow of data between the data path 46 and the circuitry external to the memory device 10 based on the decoded commands. For example, when a command/address (CA) signal includes a write command or operation, the command decoder 32 may provide a write command to the I/O interface 16 over bus 53 that indicates that the I/O interface 16 may receive data to be stored. Further, the command decoder 32 may, based on the decoded commands, provide access to a particular memory bank 12 corresponding to the command and/or address, via the bus path 40. Moreover, the memory device 10 may include various other decoders, such as row decoders and column decoders, to facilitate access to the memory banks 12. In one embodiment, each memory bank 12 includes a bank control block 22, which provides the necessary decoding (e.g., row decoder and column decoder), as well as other features, such as timing control and data control, to facilitate the execution of commands to and from the memory banks 12.

The memory device 10 may execute operations, such as read commands and write commands, based on the command/address signals received from an external device, such as a processor. As previously discussed, the command/address (CA) bus may be a 14-bit bus to accommodate the command/address signals (CA<13:0>). The command/address (CA) signals are clocked to the command interface 14 using the differential pair of clock signals 50, as discussed above. The command interface 14 may include a command/address (CA) input circuit 20, which is configured to receive and transmit the commands to provide access to the memory banks 12 through the command decoder 32. In addition, the command interface 14 may receive a chip select signal (CS_n). The chip select signal (CS_n) enables the memory device 10 to process commands on the incoming command/address signals (CA<13:0>) bus. Access to specific memory banks 12 within the memory device 10 is encoded on the command/address signals (CA<13:0>) bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The mirror (MIR) signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the test enable (TEN) signal may be used to place the memory device 10 into a test mode for connectivity testing. The command interface 14 may also be used to provide an alert signal (ALERT_n) to the system processor or controller for certain errors that may be detected. For instance, the alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the test enable (TEN) signal, as described above.

Data may be sent between the memory device 10 and the external device, utilizing the command and clocking signals discussed above, by transmitting and receiving data signals 44 through the I/O interface 16. More specifically, the data may be sent to or retrieved from the memory banks 12 over the data path 46, which includes multiple bi-directional data buses. Data I/O (DQ) signals sending the data are generally transmitted and received in one or more bi-directional data buses. For certain memory devices, such as a DDR5 SDRAM memory device, the I/O (DQ) signals may be divided into upper and lower bytes. For instance, for an x16 memory device, the I/O (DQ) signals may be divided into upper and lower I/O signals (e.g., DQ<15:8>, or upper data (UDQ) signals and DQ<7:0>, or lower data (LDQ) signals) corresponding to upper and lower bytes of the data signals, for instance. In the present disclosure, external data output (XDQ) signals may be used generally to refer to the upper data (UDQ) signals or the lower data (LDQ) signals.

To allow for higher data rates within the memory device 10, certain memory devices, such as DDR memory devices, may utilize the data strobe (DQS) signals. The data strobe (DQS) signals are driven by the external processor or controller sending the data (e.g., for a write command) or by the memory device 10 (e.g., for a read command), as discussed above. For read commands, the data strobe (DQS) signals are effectively additional data (DQ) signals with a predetermined pattern. For write commands, the data strobe (DQS) signals are used as clock signals 50 to capture the corresponding input data. As with the differential pair clock (Clk_t and Clk_c) signals 50, the data strobe (DQS) signals may also be provided as a differential pair of data strobe (DQS_t and DQS_c) signals to provide differential pair signaling during read and write operations. For certain memory devices, such as a DDR5 SDRAM memory device, the differential pairs of data strobe (DQS) signals may be divided into upper data strobe (UDQS) signals and lower data strobe (LDQS) signals (e.g., UDQS_t and UDQS_c; LDQS_t and LDQS_c) corresponding to upper and lower bytes of data sent to and from the memory device 10, for instance. In the present disclosure, XDQS may be used generally to refer to data strobe (DQS) signals, upper data strobe (UDQS) signals, or lower data strobe (LDQS) signals.

An impedance (ZQ) calibration signal may also be provided to the memory device 10 through the I/O interface 16. The ZQ calibration signal may be provided to a reference pin and used to tune output drivers and die termination (ODT) values by adjusting pull-up and pull-down resistors of the memory device 10 across changes in process, voltage, and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor may act as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data (DQ) output of the memory device 10. Loopback may include both data and a strobe or possibly just a data pin. This is generally intended to be used to monitor the data captured by the memory device 10 at the I/O interface 16.

As will be appreciated, various other components such as power supply circuits (for receiving external positive supply voltage (VDD) and negative supply voltage (VSS) signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
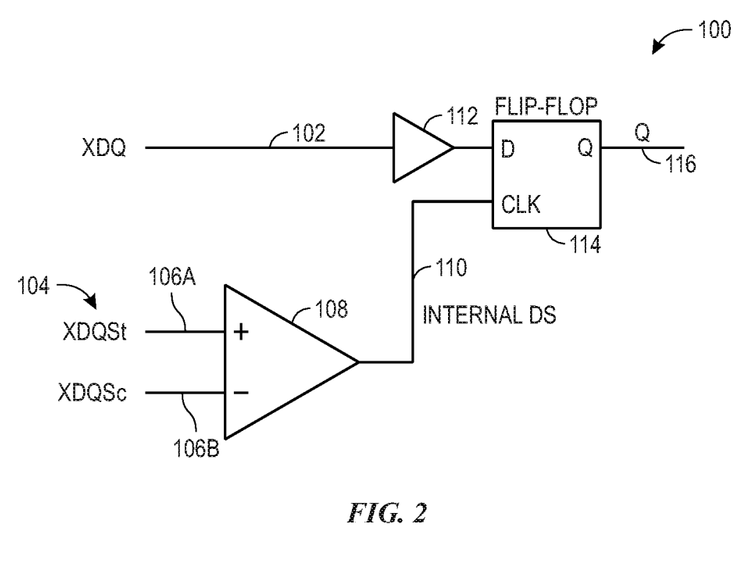
FIG. 2 is a block diagram illustrating schematic circuitry that may be used in the memory device of FIG. 1 to capture input data, in accordance with an embodiment.

As discussed above and detailed below, circuitry in the I/O interface 16 may receive data (DQ) and strobe (DQS) signals to store the data to perform a write command. FIG. 2 illustrates a diagram of a circuit 100 that receives an external data (XDQ) signal 102 (e.g., DQ, UDQ, LDQ of FIG. 1) and an external data strobe (XDQS) signal 104 (e.g., UDQS and LDQS of FIG. 1) at a flip-flop 114. Although the following discussion describes a flip-flop 114 receiving the external data (XDQ) signal 102 and the external data strobe (XDQS) signal 104, which represents a particular embodiment, the systems and methods described herein may instead use a latch (e.g., a gated latch) or other memory component. Moreover, although the following discussions describe processing the external data strobe (XDQS) signal 104 to generate an internal data strobe (DS) signal 110 (e.g., data strobe clock signal), which represents a particular embodiment, the systems and methods described herein may additionally or alternatively use any data clock signal and any data signal for the inputs into the flip-flop 114, latch, or memory component.

In some embodiments, an external device (e.g., controller) may send an external data strobe (XDQS) signal 104 as a differential pair of external data strobe clock signals 106 including a true external data strobe (XDQS_t) signal 106A and a complementary external data strobe (XDQS_c) signal 106B to the flip-flop 114. Comparator circuitry 108 (e.g., a differential amplifier) may generate a digital internal data strobe clock signal (DS) 110 to the flip-flop 114 based on a differential split between the true external data strobe (XDQS_t) signal 106A and the complementary external data strobe (XDQS_c) signal 106B. As previously discussed, memory operations may occur simultaneously and/or occur at different speeds. As such, the memory device 10 may benefit from multiple internal data strobe (DS) signals 110 to simultaneously perform the different memory operations at different speeds. By way of example, a multi-phase generator may divide the internal data strobe (DS) signal 110 into multiple internal data strobe (DS) signals 110 to enable the multiple operations.

In some embodiments, the circuit 100 may also include a delay buffer 112 that may delay the incoming external data (XDQ) signal 102 to the flip-flop 114. The flip-flop 114 may store data from the external data (XDQ) signal 102 using the internal data strobe (DS) signal 110. As previously mentioned, although the depicted embodiment describes the flip-flop 114 receiving the data signal and corresponding clock signal, which represents a particular embodiment, the systems described herein may be used with the latch that is gate triggered and/or edge triggered.

The delay buffer 112 may provide a delay to the incoming data (XDQ) signal 102 to match latencies in the external data strobe (XDQS) signal 104 path through the comparator circuitry 108 (e.g., differential amplifier). After latching the data as an output (Q) 116, the data may be available to the data path 46, as discussed above with respect to FIG. 1. It should be appreciated that a circuit having the architecture described in FIG. 1, I/O interface 16 may receive two external data strobe (XDQS) signals 104 (e.g., the lower data signal (LDQS) and the upper data signal (UDQS) or the true external data strobe (XDQS_t) signal 106A and the complementary external data strobe clock (XDQS_c) signal 106B) that may be treated by two differential amplifiers to produce two internal data strobe signals (DS) 110. In this architecture, each data strobe signal may drive eight flip-flops to latch eight bits of data. The latched data may be sent to data path 46 to perform the write command.

As previously discussed, at the beginning of a write cycle, the external data strobe (XDQS) signal 104 may have uncertain and/or inconsistent (e.g., non-differential) signals. By way of example, the true external data strobe clock (XDQS_t) 106A and the complementary external data strobe clock (XDQS_c) 106B (e.g., the external data strobe (XDQS) signal 104 as a differential pair) may rise or fall at the same or approximately the same time, causing an insufficient differential split. The insufficient differential split results in an indeterminate output by the comparator circuit 108. The indeterminate output may cause metastability in the circuit 100 and by extension, the memory device 10 that includes the circuit 100. That is, the comparator circuit 108 may use the indeterminate output to clock (e.g., data strobe clock) the flip-flop 114, further causing the flip-flop 114 to store an indeterminate value (e.g., an unknown state). Thus, the multi-phase generator that may generate multiple internal data strobe (DS) signals based on the indeterminate output from the comparator circuit 108, may also be metastable. As such, each of the multiple internal data strobe (DS) signals 110 and the memory elements they enable, such as latches and flip-flops, may also be in a metastable state.

Figure 3:
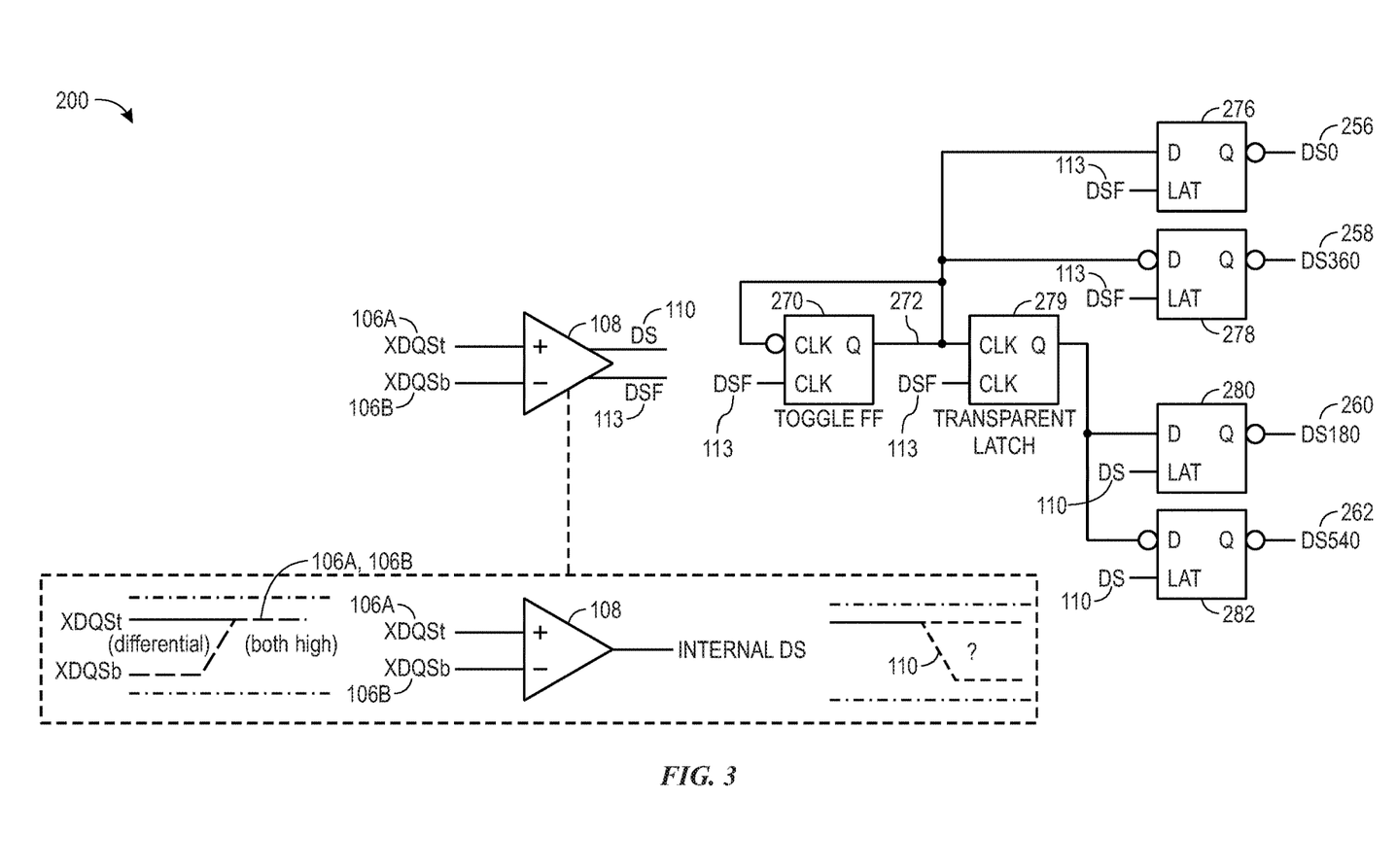
FIG. 3 is a block diagram illustrating the effect of metastability propagating through a circuit of a four-phase generator, in accordance with an embodiment.

To illustrate, FIG. 3 shows the effect of metastability propagating through a circuit of a four-phase generator 200.

Although the following discussions describe a multi-phase generator as the four-phase generator 200 to generate four internal data strobe (DS) signals 110, which describes a particular embodiment, the systems and methods described herein may include any clock generator or divider that generates one or more phases of data strobe signals (e.g., one, two, four, eight, and so forth) that may enable a respective one or more (e.g., one, two, four, eight, and so forth) memory components (e.g., latches, flip-flops, etc.). As shown, the differential pair of external data strobe (XDQS) signals 104 including the true external data strobe (XDQS_t) signal 106A and the bar external data strobe (XDQS_b) signal 106B (e.g., the complementary external data strobe (XDQS_c) signal 106B), both of which may transition to a logic high (e.g., logic 1) during the same or approximately the same time interval. The difference between the differential pair of external data strobe signals 106A and 106B as determined by the comparator circuitry 108 may not be at a level that provides a reliable or valid output. As such, the output signal to generate the internal data strobe clock signal (DS) 110, may be in indeterminate state. In some embodiments, the time interval in which the differential pair of external data strobe signals 106 transition to the same logic state (e.g., logic 1) may include a time period in which the differential pair of external data strobe clock signals 106, and thus, the wires for these clock signals, remain unused.

As previously mentioned, the insufficient difference split between the true external data strobe (XDQS_t) signal 106A and the bar external data strobe (XDQS_b) signal 106B, which are not necessarily inverted with respect to each other, may lead to an indeterminate output signal. In some instances, the indeterminate output signal may include unintended variation in the signal (e.g., unexpected peaks) since the comparator circuit 108 determining the difference split may amplify the insufficient signal, resulting in noise. As such, the indeterminate output signal to generate the internal data strobe (DS) signal 110 may also be in an indeterminate state. As shown, the indeterminate output signal may also generate a complementary internal data strobe (DSF) signal 113, which is the complement of the internal data strobe (DS) signal 110.

As depicted, the four-phase generator 200 receives the complementary internal data strobe (DSF) signal 113, which may be in a metastable state rooted to the insufficient split between true external data strobe (XDQS_t) signal 106A and the bar external data strobe (XDQS_b) signal 106B, as discussed above. The four-phase generator 200 produces four internal data strobe signals, including a first internal data strobe (DS0) signal 256, a second internal data strobe (DS180) signal 260, a third internal data strobe (DS360) signal 258, and a fourth internal data strobe (DS540) signal 262. The four internal data strobe signals 256, 258, 260, and 262 may operate at half the frequency rate of the data strobe (XDQS) signal 104, arranged in quadrature. By way of example, the first internal data strobe (DS0) signal 256 may transition to a logic high (e.g., logic 1) at every other logic high (e.g., rising edge) of the true external data strobe (XDQS_t) signal 106A. Similarly, the second internal data strobe (DS180) signal 260, the third internal data strobe (DS360) signal 258, and the fourth internal data strobe (DS540) signal 262 may transition to a logic high at every other respective logic high or low (e.g., rising edge or falling edge) of the of the true external data strobe (XDQS_t) signal 106A. By way of another example, the true external data strobe (XDQS_t) signal 106A may have a 500 picoseconds (ps) period and, as a result, the four internal data strobe signals 256, 258, 260, and 262 may have 1 nanosecond (ns) period.

To produce the four internal data strobe signals 256, 258, 260, and 262, the four-phase generator 200 may include a first toggle flip-flop 270 that is clocked by the complementary internal data strobe (DSF) signal 113, arranged in a toggling feedback loop. As a result, an output signal 272 from the first toggle flip-flop 270 may toggle at every positive edge of the complementary internal data strobe (DSF) signal 113, resulting in a clock signal that has half the frequency of the complementary internal data strobe (DSF) signal 113. The output signal 272 may input directly to a first flip-flop 276, which is clocked by the complementary internal data strobe (DSF) signal 113. The output of the first flip-flop 276 may be inverted to produce the first internal data strobe (DS0) signal 256. The output signal 272 may also input directly to a second flip-flop 278 after an inversion. Similarly, the output of the second flip-flop 278 may be inverted to produce the third internal data strobe (DS360) signal 258. The output signal 272 may also input to a flip-flop 279 that may be clocked by the complementary internal data strobe (DSF) signal 113. The flip-flop 279 may add a cycle delay to the output signal 272, which may then input directly to a third flip-flop 280, and may be provided with an inversion to a fourth flip-flop 282. The output of the third flip-flop 280 may be inverted to produce the second internal data strobe (DS180) signal 260. Similarly, the output of the fourth flip-flop 282 may be inverted to produce the fourth internal data strobe (DS540) signal 262. Thus, the depicted architecture illustrates how a metastable output signal 272 resulting from a metastable complementary internal data strobe (DSF) signal 113, may indirectly cause metastability in internal circuitry that does not directly receive inputs from the metastable output signal 272. However, in some instances, the complementary internal data strobe (DSF) signal 113 may recover to a stable state prior to the first edge of the true external data strobe (XDQS_t) signal 106A, such as by a delay (e.g., using the flip-flop 279).

Figure 4:
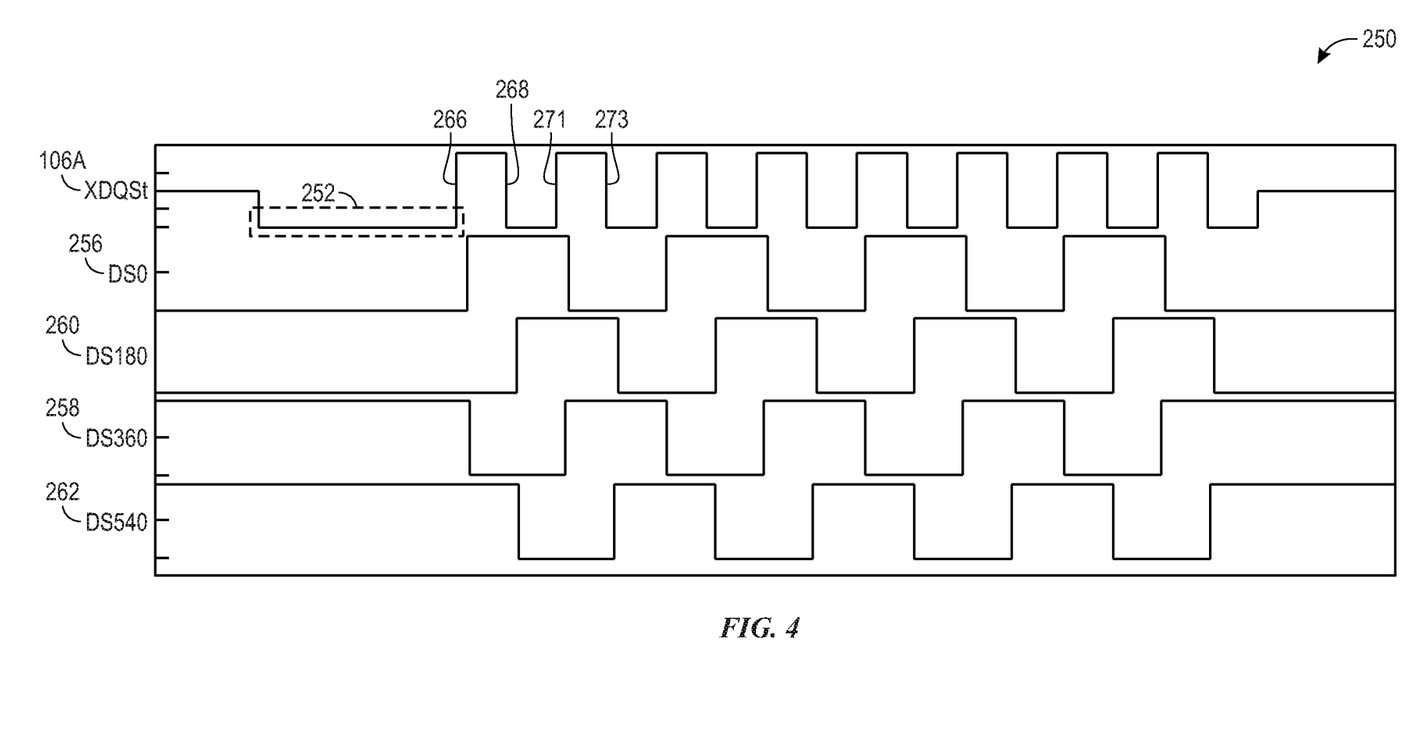
FIG. 4 is a timing diagram illustrating the four-phase clock generator with a delay to resolve metastability, in accordance with an embodiment.

To illustrate, FIG. 4 shows a timing diagram 250 illustrating the four quadrature internal data strobe signals 256, 258, 260, and 262. As previously discussed, the insufficient differential split between the true external data strobe signal (XDQS_t) signal 106A and the bar external data strobe (XDQS_b) signal 106B may lead to an indeterminate output signal determined by the comparator circuit 108. As shown, the true external data strobe (XDQS_t) signal 106A is initially in an indeterminate state (e.g., a value in between logic 0 and 1). To provide a valid state, such as a valid logic 1 (e.g., high) or logic 0 (e.g., low), the true external data strobe (XDQS_t) signal 106A may include a delay 252 (as indicated by the dashed line box), such as a preamble period for a write command operation. That is, the true external data strobe (XDQS_t) signal 106A may include a time period in which the true external data strobe (XDQS_t) signal 106A for writing data from the data (DQ) signal 102 bus is delayed. Specifically, the delay may allow sufficient time for the differential split between the true external data strobe (XDQS_t) signal 106A and the bar external data strobe (XDQS_b) signal 106B to indicate the signals to be in a valid logic state (e.g., logic 1 or 0).

The delay may allow memory components, such as a latches, flip-flops, and so forth, clocked to the true external data strobe (XDQS_t) signal 106A, or complementary internal data strobe (DSF) signal 113 outputted from comparator circuit 108 of FIG. 3, enough time to recover from the metastable state to a valid state. Recovering from metastability may allow the memory components to store the correct or intended data (e.g., bit integer 1 or 0).

In some instances, the delay period may be a time period long enough to allow the true external data strobe (XDQS_t) signal 106A to reach the valid state based on specifications of the memory device 10, memory operations performed using the true external data strobe (XDQS_t) signal 106A, and other factors. In some instances, the delay 252 may include a time period of N (e.g., one or more) cycles of the true external data strobe (XDQS_t) signal 106A. By way of example, the delay 252 may include a preamble period of two to four clock cycles. In other instances, the delay 252 may equate to ten cycles of the true external data strobe (XDQS_t) signal 106A. After the ten cycles, the memory component (e.g., the first toggle flip-flop 270) clocked to the true external data strobe (XDQS_t) signal 106A may write data from the data (DQ) signal 102. In this manner, when the memory component writes the data, it may determine whether to store a valid value of 1 or 0.

After the delay, the true external data strobe (XDQS_t) signal 106A and the bar external data strobe (XDQS_b) signal 106B may be in a valid logic state (e.g., logic 1 or 0). As such, the output (e.g., determined by the comparator circuitry 108 of FIG. 3) generating the internal data strobe (DS) signal 110 and the complementary internal data strobe (DSF) signal 113 may be accurately determined. As shown, after the delay 252, the true external data strobe (XDQS_t) signal 106A may be in a valid state of logic 1. At this first external clock rising edge 266, the first internal data strobe (DS0) signal 256 may also be at a logic 1 (e.g., rising edge), such that the first internal data strobe (DS0) signal 256 is 0° or approximately 0° out of phase from the first external clock rising edge 266. After some time period, the true external data strobe (XDQS_t) signal 106A may transition to a logic 0 (e.g., falling edge). At this first external clock falling edge 268, the second internal data strobe (DS180) signal 260 may be at a logic 1 (e.g., rising edge). The second internal data strobe (DS180) signal 260 may be 180° or approximately 180° out of phase from the first external clock rising edge 266.

The true external data strobe (XDQS_t) signal 106A may transition back to a logic 1 (e.g., second rising edge). At a second external clock rising edge 271, the third internal data strobe (DS360) signal 258 may also be at a logic 1 (e.g., rising edge), such that the third internal data strobe (DS360) signal 258 is 360° or approximately 360° out of phase from the first external clock rising edge 266. The true external data strobe (XDQS_t) signal 106A may again transition to a logic 0 (e.g., falling edge). At a second external clock falling edge 273, the fourth internal data strobe (DS540) signal 262 may be 540° or approximately 540° out of phase from the first external clock rising edge 266. Thus, the four internal clock signals generated from the true external data strobe (XDQS_t) signal 106A may operate at half the frequency rate of the true external data strobe (XDQS_t) signal 106A (e.g., two cycles of the true external data strobe c (XDQS_t) signal 106A for a cycle of each of the four internal data strobe signals), arranged in quadrature. Moreover, as shown in the timing diagram 250, the first internal data strobe (DS0) signal 256 and the third internal data strobe (DS360) signal 258 may be complementary signals while the second internal data strobe (DS180) signal 260 and the fourth internal data strobe (DS540) signal 262 may be complimentary signals.

As previously mentioned, the delay 252 may be used to provide sufficient time to obtain a valid state for the true external data strobe (XDQS_t) signal 106A and the bar external data strobe (XDQS_b) signal 106B, to reliably determine a difference (e.g., the true external data strobe (XDQS_t) signal 106A is a logic 1 and the bar external data strobe clock signal (XDQS_b) 106B is a logic 0) to generate a valid output (e.g., the internal data strobe (DS) signal 110 and/or the complementary internal data strobe (DSF) signal 113). As a result, the memory operations performed by the memory components clocked to the internal data strobe (DS) signal 110 or the complementary internal data strobe (DSF) signal 113 may also be delayed. Thus, mitigating metastability in the four-phase generator 200 using the delay 252 may slow down memory operations and/or the memory device 10, and by extension, unnecessarily lock resources of the memory device 10 and/or overconsume power for extended periods of time. As will be discussed with respect to the following figures, metastability in input circuitry may be mitigated and/or resolved relatively faster by amplifying feedback in the clock phase generator 200.

Figure 5:
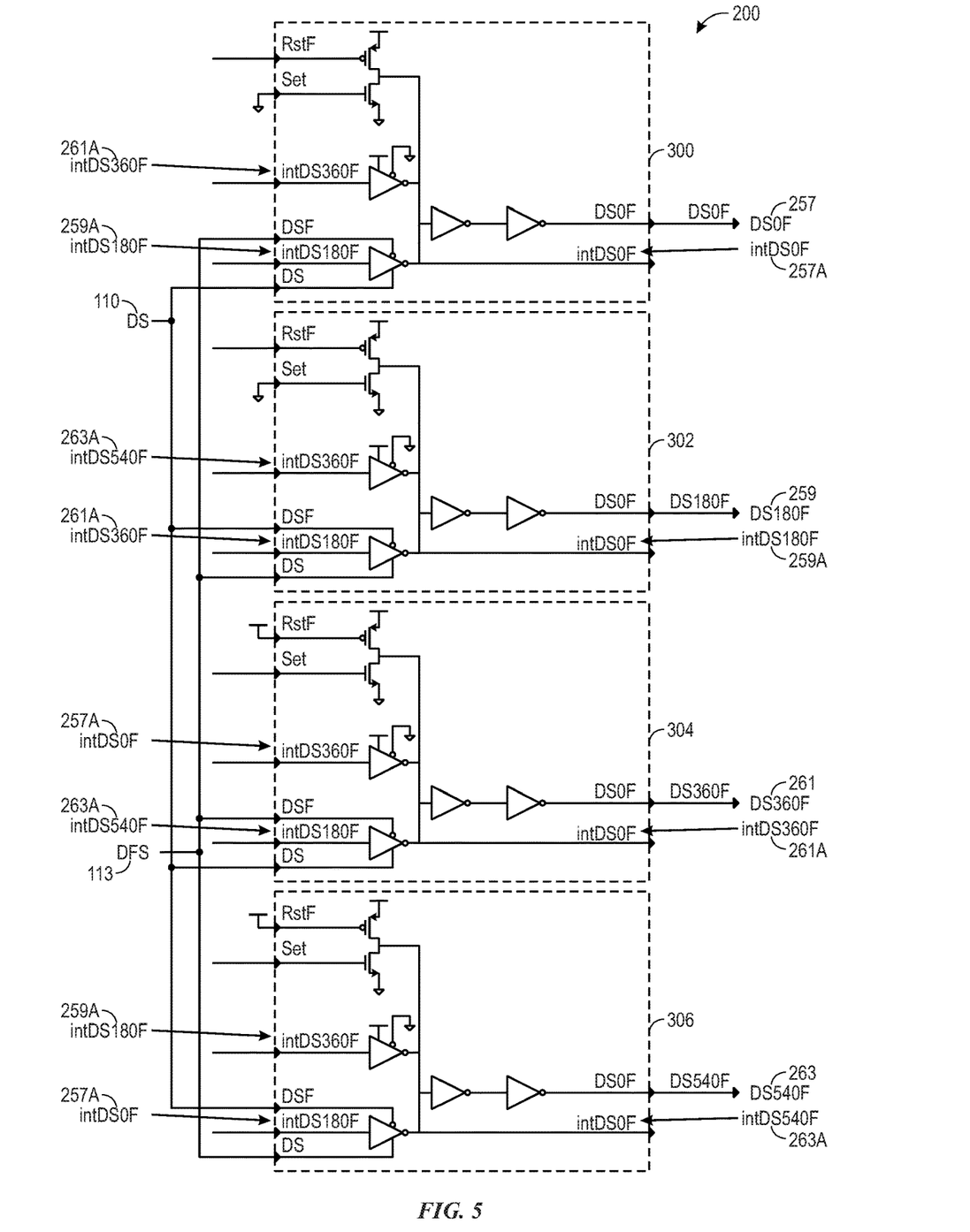
FIG. 5 is a block diagram illustrating schematic circuitry of the four-phase clock generator, in accordance with an embodiment.

To illustrate, FIG. 5 depicts the four-phase generator 200 and its cross-coupling circuitry that provides feedback and feedforward paths. The four-phase generator 200 may be referred to as a quad-phase lat (e.g., latch). Although the following discussions describe four latches of the four-phase generator 200, which represents a particular embodiment, the circuits and methods described herein may use a clock generator with greater or fewer number of latches to generate a respective greater or fewer number of clock phases (e.g., two, six, eight, and so forth). As shown, the four-phase generator 200 may include a first latch 300, a second latch 302, a third latch 304, and a fourth latch 306. The latches 300, 302, 304, and 306 may be clocked to the internal data strobe (DS) signal 110 and/or the complementary internal data strobe (DSF) signal 113. The first latch 300 may output a first complementary data strobe (DS0F) signal 257, the second latch 302 may output a third complementary data strobe (DS180F) signal 259, the third latch 304 may output a third complementary data strobe (DS360F) signal 261, and the fourth latch 306 may output a fourth complementary data strobe (DS540F) signal 263. The complementary data strobe signals 257, 259, 261, and 263 may provide the feedback paths, as will be discussed in detail with respect to FIG. 6.

Each of the latches may also receive and/or output a corresponding internal complementary data strobe signal that ensures that the cross-coupling feature of the four-phase generator 200 is properly functioning. As shown, the first latch 300 that outputs the first complementary data strobe (DS0F) signal 257 may also output a corresponding internal first complementary data strobe (intDS0F) signal 257A. Similarly, the second latch 302 that outputs the second complementary data strobe (DS180F) signal 259 may also output a corresponding internal second complementary data strobe (intDS180F) signal 259A. Moreover, the third latch 304 that outputs the third complementary data strobe (DS360F) signal 261 may also output a corresponding internal third complementary data strobe (intDS360F) signal 261A. Furthermore, the fourth latch 306 that outputs the fourth complementary data strobe (DS540F) signal 263 may also output a corresponding internal fourth complementary data strobe (DS540F) signal 263A. The internal complementary data strobe signals 257A, 259A, 261A, and 263A may provide the feedback paths and the feedforward paths, as will be discussed in detail with respect to FIG. 6. That is, the complementary data strobe signals may provide feedback paths while the internal complementary data strobe signals may provide feedforward paths to ensure that corresponding complementary data strobe signals feeds back into a respective latch to drive a particular output. The positive feedback and feedforward paths of the four-phase generator using the complementary data strobe signals and the internal complementary data strobe signals, may allow the latches 300, 302, 304, and/or 306 to recover from metastability relatively faster than without the feedback and feedforward paths.

By way of example, the internal third complementary data strobe (intDS360F) signal 261A is an input to the first latch 300 and is an output of the third latch 304. Similarly, the internal first complementary data strobe (intDS0F) signal 257A is an input to the third latch 304 and is an output of the first latch 300. That is, the internal first complementary data strobe (intDS0F) signal 257A and the internal third complementary data strobe (intDS360F) signal 261A provide positive feedback via cross-coupling from the first latch 300 to the third latch 304. As such, the metastable state of these latches 300 and 304 and/or their respective outputs (e.g., the first complementary data strobe (DS0F) signal 257 and the third complementary data strobe (DS360) signal 261A) may recover from metastability using positive feedback. The second latch 302 and the fourth latch 306 and their respective input and output signals may operate similarly.

Figure 6:
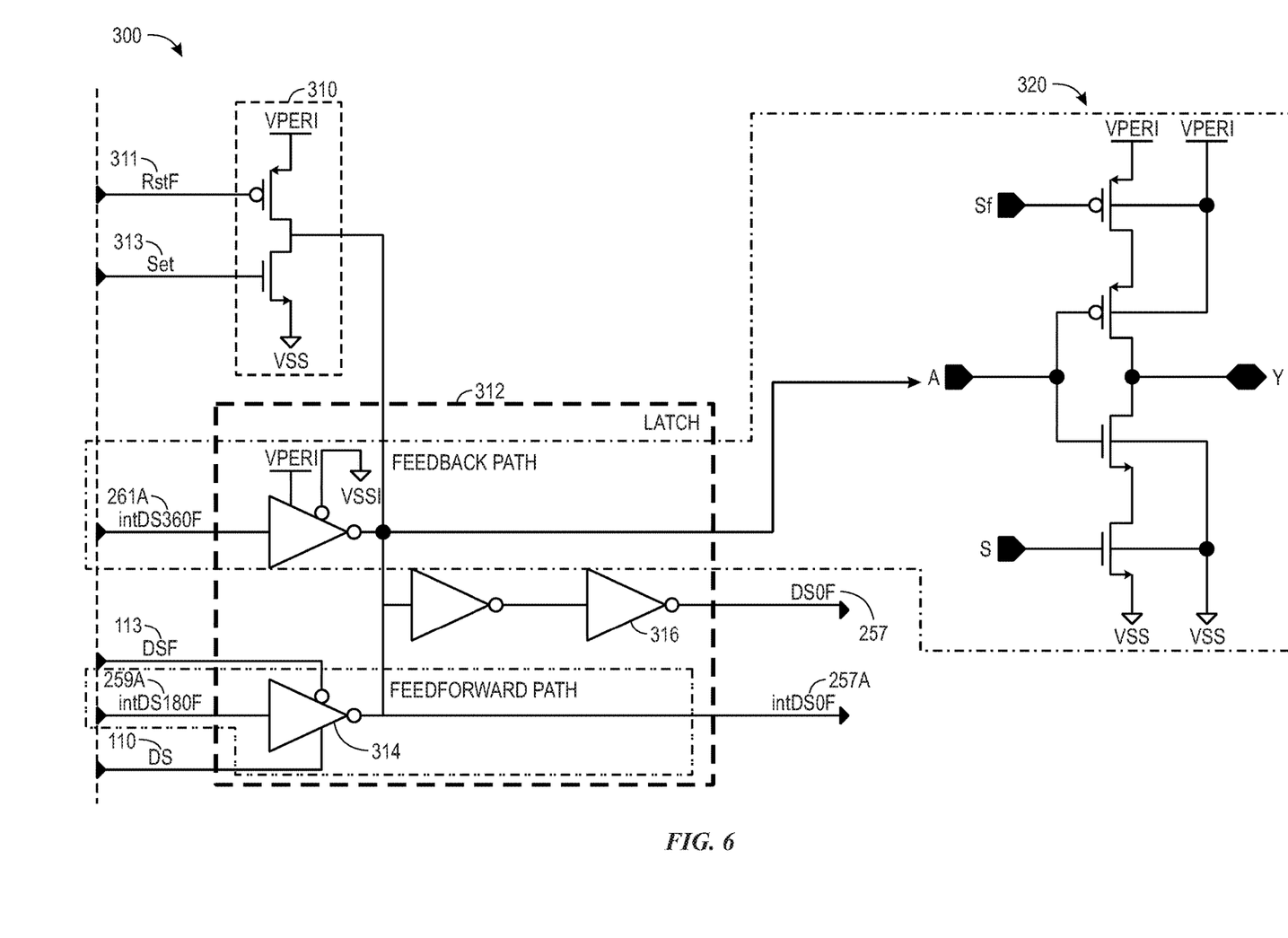
FIG. 6 is a block diagram illustrating cross-coupling circuitry of a latch of the four-phase clock generator of FIG. 5, in accordance with an embodiment.

FIG. 6 illustrates the cross-coupling circuitry of the first latch 300 of the four-phase generator 200 of FIG. 5 to describe the feedforward and feedback circuitry. As indicated by a bold dash line box, the first latch 300 includes a latch 312 (e.g., the first latch 300 of FIG. 5). The latch 312 may include multiple inverters (e.g., two inverters, four inverters as depicted, six inverters, and so forth), which may provide a feedforward path and/or a feedback path. Metastability may be mitigated notably by use of a complementary signal connection with a complementary latch. As discussed with respect to FIG. 5, the four latches 300, 302, 304, and 304 may include two latches that are complementary (e.g., first latch 300 to the third latch 304 and the second latch 302 to the fourth latch), such that the four latches function as two complementary pairs. When one of the paired latches output is high (e.g., first latch 300) the other latch's output is low (e.g., third latch 304). In feedback to each other, the paired latches create more gain via those complementary connections. That is, the notable metastable-mitigation advantage may include more gain via complementary latches and feedback. In particular, the paired latches provide additional gain similar to the functionality of a differential amplifier, which provides twice the gain of a single-ended amplifier for the same input swing of input(s).

As indicated by a dash line box and arrow, a feedback path may include the internal third complementary data strobe (intDS360F) signal 261A as an input signal providing a feedback path to another latch 320 (e.g., the third latch 304 of FIG. 5). That is, the internal third complementary data strobe (intDS360F) signal 261A may provide additional input to feedback into latch 320, which may be in a metastable state, to facilitate resolving the latch 320 to a stable state. By way of example, the latch 320 may include a latch clocked to the first complementary data strobe (DS0F) signal 257, such that the internal third complementary data strobe (intDS360F) signal 261A may resolve the first complementary data strobe (DS0F) signal 257 and/or its outputs from metastability. Moreover, the latch 320 may couple to an output node (not shown) of the first latch 300 to latch strobe clock signal levels (e.g., the first complementary data strobe signal (DS0F) 257 and/or the internal first complementary data strobe clock signal (intDS0F) 257A).

As indicated by another dash line box, a feedforward path may include a first inverter 314 transmission gate that may selectively provide a feedforward signal that is activated by the internal data strobe (DS) signal 110 and/or the complementary internal data strobe (DSF) signal 113, as opposed to a latch without a feedforward path to mitigate metastability.

In some embodiments, the latch 312 may receive a respective enable signal (e.g., via a command decoder 32 of FIG. 1). Respective strobe driver circuits (not shown) may receive and use these enable signals to provide a logic high level or a logic low level output signal to an output node of the strobe driver based on the signals (e.g., pull up and pull down signals for transistors in a strobe driver circuit) from the latch 312.

Moreover, the latch 300 may include a set of buffer inverters 310. That is, the set of inverters 310 may function as a buffer. Although the following description discusses the set of buffer inverters 310 as including inverters, which represents a particular embodiment, the circuits and methods described herein may also include other compatible inverting and/or buffer circuits. The set of buffer inverters 310 may provide an electrical impedance transformation from one circuit to another (e.g., the signal is "buffered from" load currents).

In some embodiments, a reset (RstF) signal 311 and a set (Set) signal 313 may be input signals to the set of buffer inverters 310. The reset (RstF) signal 311 may reset the first latch 300 of inverter circuits, such as to provide a high clock level. The latch 300 may be triggered to a high state by the set (Set) signal 313 and may hold the value (e.g., output Q 116 of FIG. 2) until a reset, such as by the reset (RstF) signal 311 to drive the latch 300 to a low state. Thus, the feedforward and feedback paths described may allow the latch 300, and by extension, the four-phase generator 200 that may include the latch 300 and similar latches, to recover from metastability. In some instances, the four-phase generator 200 may not recover from metastability within a critical time period, such that memory components and/or memory operations may not function as expected when using the generated internal data strobe clock signals. In such instances, providing higher gain and/or lower capacitive loading in the four-phase generator 200 may allow for reliable and faster recovery from metastability.

Figure 7A:
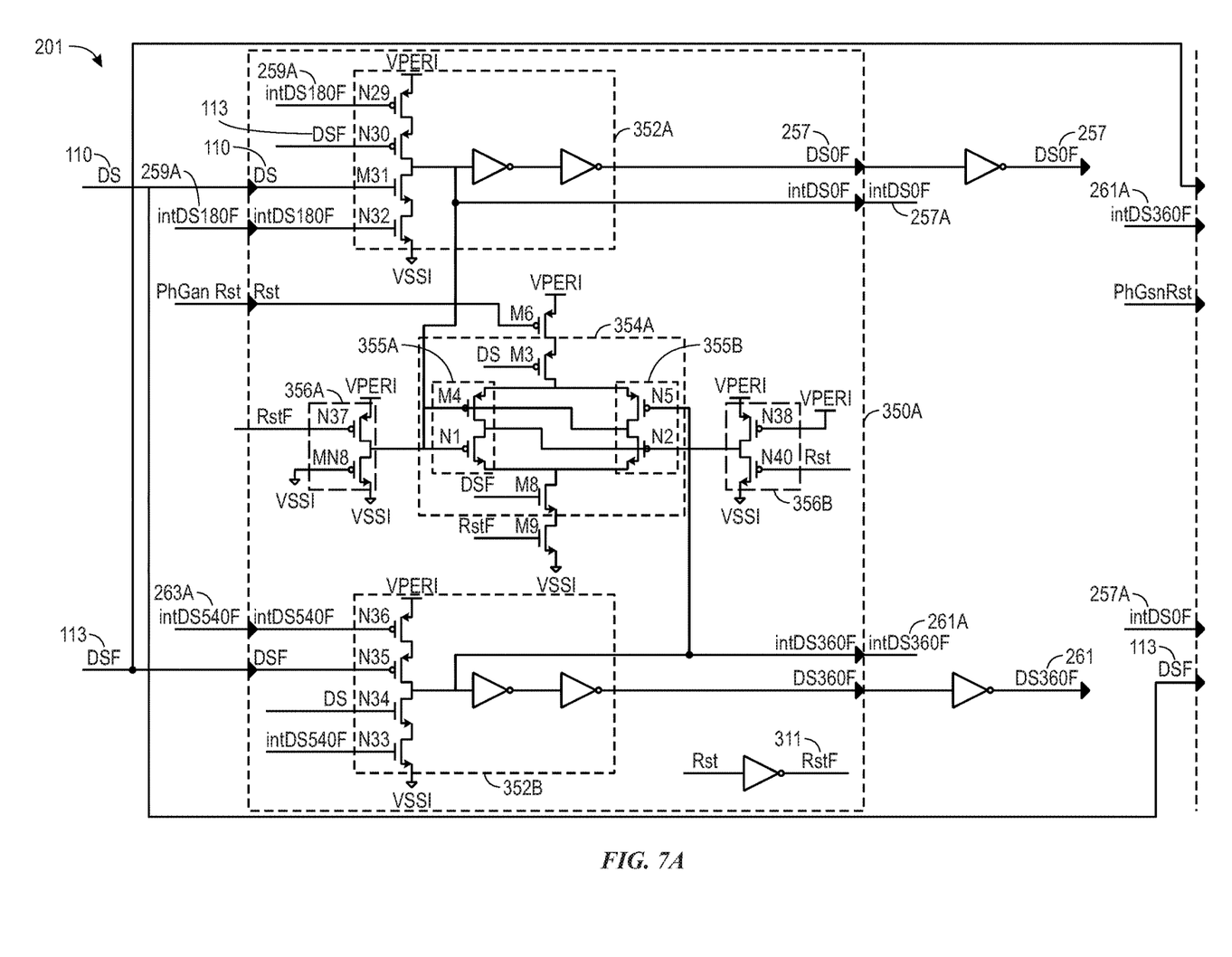
FIG. 7A is a block diagram illustrating a first portion circuitry of a modified four-phase clock generator that maximizes amplification in the feedback path of the memory device to accurately capture data, in accordance with an embodiment.
Figure 7B:
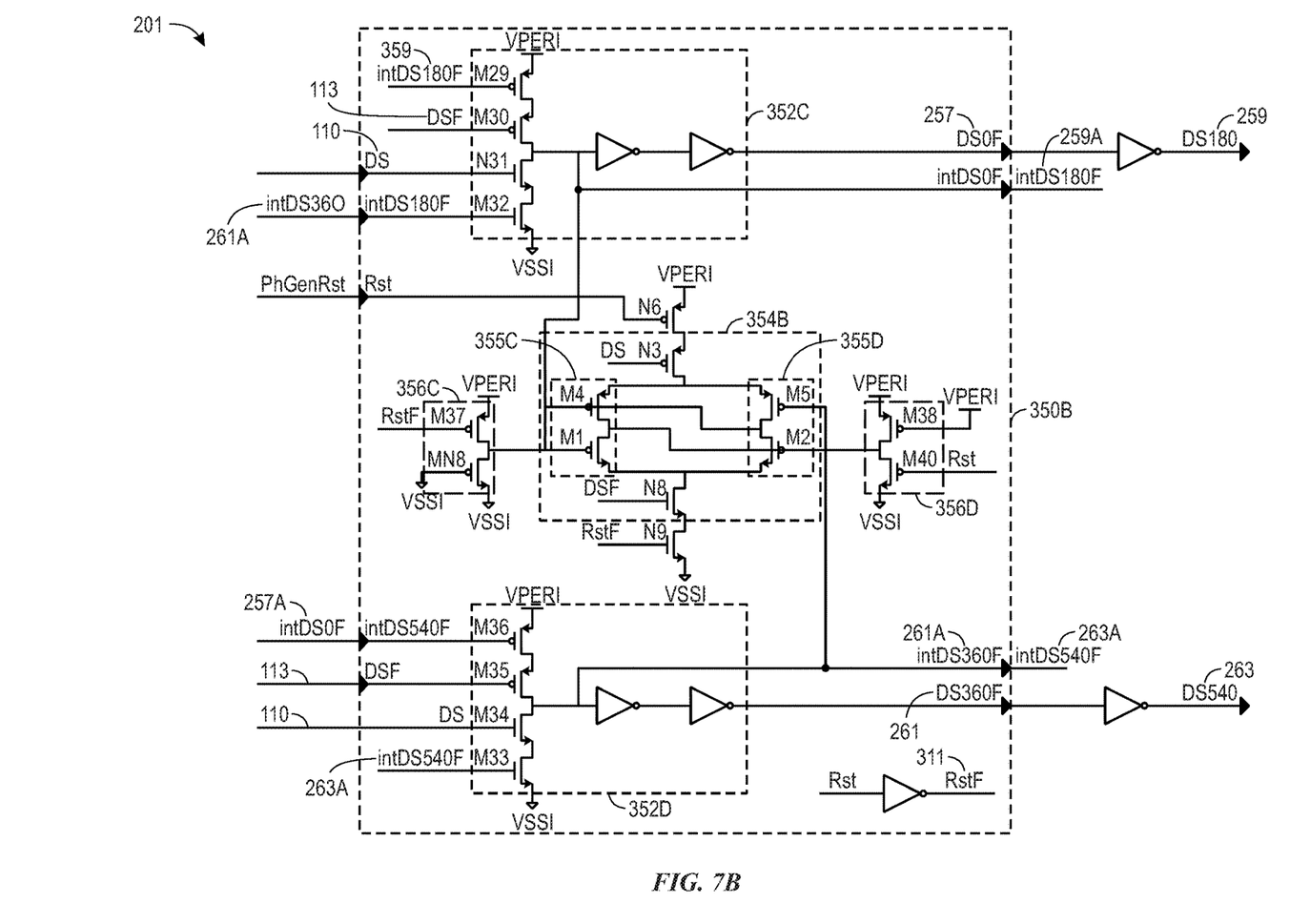
FIG. 7B is a block diagram illustrating a second circuit portion of circuitry of the modified four-phase clock generator that maximizes amplification in the feedback path of the memory device to accurately capture data, in accordance with an embodiment.

To illustrate, FIG. 7A and FIG. 7B depict a modified four-phase generator 201 having a sense amplifier-type architecture to generate complementary outputs. That is, the following descriptions describe the modified four-phase generator 201 to function similar to a sense amplifier, which amplifies a measured voltage to a useful voltage. For example, this architecture may amplify the data strobe clock signals of the modified four-phase generator 201 to resolve the insufficient differential split between competing data strobe signals, as previously discussed. In particular, a sense amplifier is a fundamental amplifier for DRAM devices. It is used in a memory block array to sense and amplify, and latch small voltage differences onto cell bit lines when a word line is activated. The sense amplifier is also used in other applications in which small voltage differences may be amplified. Since the sense amplifier provides a very high gain amplifier architecture, especially for a single-stage amplifier, this architecture may be used to quickly recover from metastability.

FIG. 7A depicts a first latch 352A (indicated by a dash box) and a second latch 352B (indicated by a dash box) merged together as a first single quad-phase device 350A. Similarly, FIG. 7B depicts a third latch 352C and a fourth latch 352D (e.g., two latches) merged together as a second single quad-phase device 350B. As previously mentioned, the four-phase generator 200 may include four single latches that are cross-wired or coupled that may be referred to as a quad-phase lat. Rather than using single latches, the modified four-phase generator 201 uses these two pairs (e.g., the first single quad-phase device 350A and the second single quad-phase device 350B) of merged latches (e.g., 352A-D, respectively) to provide the same functions as the four single latches (e.g., 352A-D). The two pairs of merged latches may be referred to as a quad-phase lat pair.

The sense amplifier-type architecture may cause output nodes (e.g., nodes outputting complementary data strobe signals and/or internal complementary data strobe signals) to be complementary, allowing the modified four-phase generator 201 to function as intended or expected (e.g., provide feedback and feedforward paths using the complementary outputs). Furthermore, the sense amplifier-type latch architecture may allow for reliably mitigating metastability such that the circuitry of the modified four-phase generator 201 always or approximately always recovers from metastability, as opposed to, for example, the four-phase generator 200 that may or may not recover from metastability with certainty. By way of example, the four-phase generator 200 of FIG. 5 may recover from metastability approximately 75% of the time while the modified four-phase generator 201 may recover from metastability 100% or approximately 100% of the time (e.g., 95%, 96%, or 97% of the time).

Merging the latches (e.g., 352A with 352B and 352C with 352D) may allow the sense amplifier-type latch architecture to share a common source device (e.g., current-steering device or amplifier). The common source device may provide benefit of a differential amplifier with respect to current theory. That is, this circuitry architecture allows resolving current from one side of the modified four-phase generator 201 to the other side of the modified four-phase generator 201, and as such, providing complementary outputs. The complementary outputs of the sense amplifier-type latch may provide relatively higher gain and lower capacitive loading with respect to the four-phase generator 200 of FIG. 5.

As shown, the first single quad-phase device 350A of FIG. 7A merges the two feedback latches, the first latch 352A with the second latch 352B, using a first set of transistors 354A. The architecture of the first set of transistors 354A is similar to a sense amplifier circuit. That is, the first set of transistors 354A includes, a first inverter 355A including transistors M4 and N1 and a second inverter 355B including transistors N5 and N2. The first inverter 355A and the second inverter 355B are cross coupled, in which the nodes of the inverters 355A and 355B are controlled by a gating clock node (e.g., input clock). This sense amplifier-type circuit of the first set of transistors 354A allows the modified four-phase generator 201 to drive a pull-down current from one side of the four-phase generator 201 and drive a pull-up current to the other side, such as to drive the outputs of first latch 352A and the second latch 352B to become complementary outputs (e.g., the first complementary data strobe (DS0F) signal 257 to be complementary to the third complementary data strobe (DS360F) signal 261, and vice versa). As previously discussed, the complementary outputs may drive the latches 352 out of metastability to provide valid outputs.

By way of example, when the internal data strobe (DS) signal 110 is high (e.g., logic 1), a first feedforward path of the first modified four-phase generator 201 that includes the first latch 352A (e.g., top half circuit of the first single quad-phase device 350A) may be activated. On the other hand, when the internal data strobe (DS) signal 110 is low (e.g., logic 1), then a second feedforward path including the second latch 352B (e.g., bottom half circuit of the first single quad-phase device 350A) may be activated. Specifically, when the internal data strobe (DS) signal 110 is high, the first complementary data strobe (DS0F) signal 257 and the second complementary data strobe (DS360F) signal 259 may change in a complementary manner (e.g., one goes high while the other goes low) through the feedforward and/or feedback paths. By way of example, when the internal data strobe (DS) signal 110 is high in the first feedforward path, the complementary internal data strobe (DSF) signal 113 may transition to high while the second complementary data strobe (DS360F) signal 259 may transition to low or vice versa, depending on a configuration of the modified four-phase generator 201.

When the internal data strobe (DS) signal 110 transitions to low (e.g., logic 0), the top feedforward path is decoupled (e.g., inactivated) and the first set of transistors 354A is activated to hold the last state or output of the latch 352A and the latch 352B. In comparison to the four-phase generator 200 discussed with respect to FIG. 5, the first set of transistors 354A of the depicted modified four-phase generator 201 holds the present output of the latches 352A and 352B rather than relying on cross-coupling between the two latches to guarantee the complementary strobe signals or internal complementary data strobe signals provide positive feedback to drive the respective complementary data strobe signals. By way of example, the first complementary data strobe (DS0F) signal 257 is complementary to the third complementary data strobe (DS360F) signal 261. Holding the outputs provides the positive feedback. Specifically, the positive feedback relies on a common source gate n-channel transistor (e.g., transistor M3) connected to the complementary internal data strobe (DSF) signal 113 and a common source p-channel transistor (e.g., transistor M8) connected to the internal data strobe (DS) signal 110. That is, the common source transistors may be activated when the internal data strobe (DS) signal 110 is active. This allows current to steer towards one direction or output (e.g., output of the first inverter 355A or the output of the second inverter 355B. That is, since the common-source devices (e.g., M3 & M8) may be considered a constant-current source and the first inverter 355A (e.g., M4 and N1) and the second inverter 355B (e.g., N5 and N2) are cross-coupled connections, all of the constant current will tend to be steered through either the first inverter 355A or the second inverter 355B.

Specifically, the first inverter 355A and the second inverter 355B may be cross-coupled and may compete for current coming through the p-channel transistor (e.g., one inverter tries to transition to logic high while the other inverter tries to transition to logic low) when current is applied to the modified four-phase generator 201, for instance. However, the inverter that has more gate bias voltage may drive more of the current. The more current one of the competing inverters receives (e.g., the first inverter 355A), the more that the inverter drives its output higher and thus, further cuts off current from the other inverter (e.g., the second inverter 355B). The exponential current driven by the particular inverter receiving relatively more gate bias voltage, creates a current cascading effect. The cascading effect provides amplification and more current steering, and thus, provides amplification of the outputs. The amplified outputs may provide a reliable sensing or measurement of the output (e.g., logic 1 or 0). By way of example, the amplified outputs may provide a reliable difference between the outputs to determine the differential split of the internal data strobe clock signals, allowing the modified four-phase generator 201 to recover from metastability.

In some embodiments, the first single quad-phase device 350A of the modified four-phase generator 201 may optionally (as indicated by the long dash line box) include a first reset device 356A that includes transistor N37 and MN8, a second reset device 356B that includes transistors N38 and N40, and a third reset device 356C that includes transistor M6. Similarly, the second single quad-phase device 350B may include a fourth reset device 356D that includes transistors M38 and M40, a fifth reset device 356E that includes transistors M38 and M40, and a sixth reset device 356F that includes transistor M9. Although the following descriptions discuss the reset devices 356 as including two transistors, which represents a particular embodiment, the methods and systems described herein may use one or more transistors. In some embodiments, the modified four-generator 201 may not include the reset devices 356.

In the depicted embodiment, the first reset device 356A may be connected to the first inverter 355A of the first set of transistors 354A. Similarly, the second reset device 356B may be connected to the second inverter 355B of the first set of transistors 354A. The third reset device 356C may be connected to the sense amplifier-type latch architecture of the first set of transistors 354A. That is, a reset device 356 may be connected to each inverter of the first set of transistors 354A. The reset devices 356 may drive the respective outputs to and from the inverters to certain states (e.g., logic 1 or 0) by resetting. Moreover, the reset devices 356 may allow resetting the outputs from the inverters of the first set of transistors 354A and independently from the internal data strobe (DS) signal 110 and/or from the complementary data strobe (DSF) signal 113. In this manner, the competing inverters 355A and 355B do not compete or rely on the current and/or internal data strobe signals. Furthermore, the second single quad-phase device 350B of FIG. 7B may operate similarly to the first single quad-phase device 350A of FIG. 7A to provide the same features (e.g., sense amplifier-type latch architecture to resolve the third latch 352C and the fourth latch 352D), optional reset devices 356, and holding states of the inverters in the second set of transistors 354B).

Figure 8:
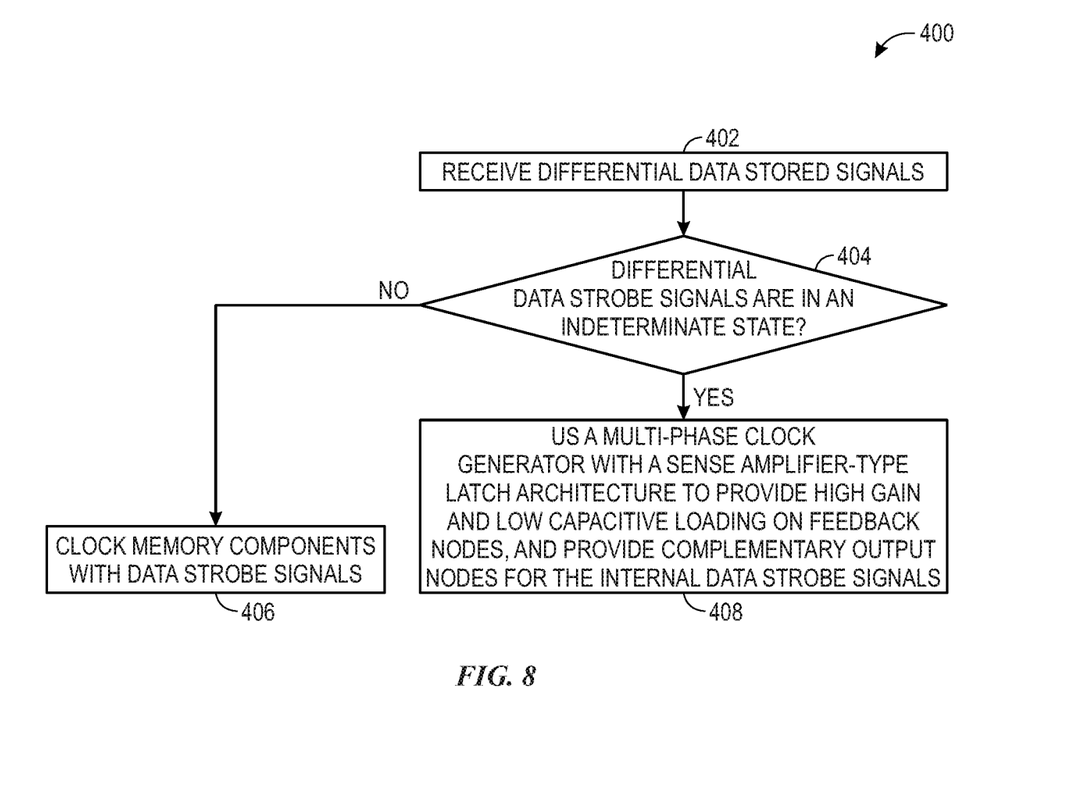
FIG. 8 is a flow chart of a method to mitigate metastability using the modified four-phase clock generator, in accordance with an embodiment.

The flowchart in FIG. 8 is a flowchart of a process for metastability mitigation 400 in a multi-phase generator according to embodiments of the present disclosure. Any suitable device or circuitry that may control components of the memory device 10, such as the modified four-phase generator 201, may perform metastability mitigation 400. While the metastability mitigation is described using steps in a specific sequence, it should be understood that the present disclosure contemplates that the described steps may be performed in different sequences than the sequence illustrated, and certain described steps may be skipped or not performed altogether.

The process 400 may include an input circuitry receiving (process block 402) differential pair of external data strobe (XDQS) signals 106. As discussed with respect to FIG. 3, the differential pair of external data strobe (XDQS) signals 106 including the true external data strobe (XDQS_t) signal 106A and the bar external data strobe (XDQS_b) signal 106B may transition to a logic high (e.g., logic 1) during the same or approximately the same time interval. The difference between the differential pair of external data strobe signals 106A and 106B as determined by the comparator circuitry 108 may not be at a level that provides a reliable or valid output.

As previously discussed, this insufficient difference split between the true external data strobe (XDQS_t) signal 106A and the bar external data strobe (XDQS_b) signal 106B may lead to an indeterminate output signal. As such, the process 400 may include the input circuitry determining (decision block 404) whether the differential data strobe signals are in an indeterminate state. That is, if the differential data strobe signals 106 are in a valid state of a logic 1 or 0 and/or approximately in a valid state of approximately a logic 1 or a logic 0, such that the signals may be reliably determined to be in a logic state of 1 or 0, then the differential data strobe signals 106 may not be in indeterminate states. In some instances, reliably determining a logic state of 1 or 0 may be based on a threshold range deviation from a logic 1 or 0 that may be specified by a memory standard (e.g., DDR5 specification).

When the differential data strobe signals 106 are not in an indeterminate state, the process 400 may include proceeding (process block 406) to clock memory components with internal data strobe signals that are generated based on the differential data strobe signals 106. In some instances, determining indeterminate or determinate states of the differential data strobe signals 106 may be implemented after a predetermined time period (e.g., a delay).

On the other hand, if the differential data strobe signals 106 are in an indeterminate state, then the input circuitry may determine using (process block 408) a multi-phase clock generator (e.g., the modified four-phase generator 201) with a sense amplifier-type latch architecture to provide high gain and low capacitive loading on feedback nodes, and provide complementary output nodes for the internal data strobe signals, as discussed with respect to FIGS. 7A and 7B.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A multi-phase clock generator, comprising:
a set of transistors comprises a first inverter and a second inverter, wherein the first inverter provides a first phase data strobe signal and the second inverter provides a second phase data strobe signal;
a first latch coupled to the set of transistors; and
a second latch coupled to the set of transistors and the first latch via the set of transistors;
wherein the set of transistors are configured to:
receive a first portion of current at the first inverter and a second portion of current at the second inverter, wherein the first portion is greater than the second portion;
amplify the first portion of current in response to the first portion being greater than the second portion; and
drive the first phase data strobe signal using the amplified first portion.

2. The multi-phase clock generator of claim 1, wherein the first phase data strobe signal and the second phase data strobe signal are outputs of an indeterminate internal data strobe signal.

3. The multi-phase clock generator of claim 1, wherein the set of transistors provides complementary outputs to the first phase data strobe signal and the second phase data strobe signal.

4. The multi-phase clock generator of claim 1, wherein the first inverter and the second inverter are cross-coupled.

5. The multi-phase clock generator of claim 1, wherein driving the first phase data strobe signal using the amplified first portion drives the first phase data strobe signal out of an indeterminate state or a valid state of a logic 1 or a logic 0.

6. The multi-phase clock generator of claim 1, comprising:
a set of reset devices coupled to the set of transistors, the first inverter, the second inverter, or a combination thereof, wherein the set of reset devices is configured to reset a logic state of first inverter, the second inverter, or a combination thereof.

7. The multi-phase clock generator of claim 6, wherein the set of reset devices is configured to reset logic states independently from an internal data strobe signal, a complementary internal data strobe signal, or a combination thereof, of the multi-phase clock generator.

8. The multi-phase clock generator of claim 1, wherein the multi-phase clock generator generates two or more data strobe clock signals out of phase from each other.

9. The multi-phase clock generator of claim 1, comprising:
a third latch; and
a fourth latch, wherein the multi-phase clock generator comprises a four-phase generator.

10. A method to prevent metastability in a memory device comprising a four-phase generator, comprising:
receiving a pair of differential data strobe signals at the four-phase generator, wherein the four-phase generator comprises a set of transistors configured to provide a sense amplifier functionality;
determining that the pair of differential data strobe signals are in an indeterminate state; and
in response to determining that the pair of differential data strobe signals are in the indeterminate state, using the four-phase generator configured to merge two or more latches and using the set of transistors to provide amplification at output nodes of the two or more latches on a feedback path of the four-phase generator.

11. The method of claim 10, wherein the set of transistors comprises a first inverter and a second inverter, wherein the four-phase generator is configured to amplify and hold a logic state of each of the two or more latches to provide as feedback on the feedback path.

12. The method of claim 10, wherein the four-phase generator is configured to generate four-phase internal data strobe signals from an internal data strobe signal, wherein the four-phase internal data strobe signals operate at half a frequency rate of the internal data strobe signal.

13. The method of claim 10, wherein the four-phase internal data strobe signals are arranged in a quadrature, wherein a first internal data strobe signal of the four-phase internal data strobe signals is 0° out of phase from the internal data strobe signal, wherein a second internal data strobe signal of the four-phase internal data strobe signals is 180° out of phase from the internal data strobe signal, wherein a third internal data strobe signal of the four-phase internal data strobe signals is 360° out of phase from the internal data strobe signal, and wherein a fourth internal data strobe signal of the four-phase internal data strobe signals is 540° out of phase from the internal data strobe signal.

14. The method of claim 13, wherein the four-phase generator is configured to provide the third internal data strobe signal as positive feedback to the first internal data strobe signal to drive the first internal data strobe signal to a valid state.

15. The method of claim 14, wherein the valid state comprises a logic 1 or a logic 0.

16. The method of claim 13, wherein the first internal data strobe signal and the third internal data strobe signal are complementary, and wherein the second internal data strobe signal and third internal data strobe signal are complementary.

17. The method of claim 10, wherein the indeterminate state comprises a value between a logic 0 and a logic 1.

18. The method of claim 10, wherein providing high gain:
receiving a first portion of current at a first inverter and a second portion of current at a second inverter of the set of transistors, wherein the first portion is greater than the second portion;
amplifying the first portion of current in response to the first portion being greater than the second portion; and
driving a first internal data strobe signal using the amplified first portion.

19. A multi-phase clock generator, comprising:
a first set of transistors comprises a first inverter and a second inverter, wherein the first inverter provides a first phase data strobe signal and the second inverter provides a second phase data strobe signal;
a second set of transistors comprises a third inverter and a fourth inverter, wherein the third inverter provides a third phase data strobe signal and the fourth inverter provides a fourth phase data strobe signal;
a first latch coupled to the first set of transistors;
a second latch coupled to the first set of transistors and the first latch via the first set of transistors;
a third latch coupled to the second set of transistors; and
a fourth latch coupled to the second set of transistors and the third latch via the second set of transistors;
wherein the first set of transistors and the second set of transistors are respectively configured to:
receive a first portion of current at the first inverter, a second portion of current at the second inverter, a third portion of current at the third inverter, and a fourth portion of current at the fourth inverter, wherein the first portion is greater than the second portion, and
wherein the third portion is greater than the fourth portion;
amplify the first portion of current in response to the first portion being greater than the second portion and the third portion of current in response to the third portion being greater than the fourth portion; and
drive the first phase data strobe signal using the amplified first portion and the third phase data strobe signal using the amplified third portion.

20. The multi-phase clock generator of claim 19, wherein the first set of transistors and the second set of transistors each comprise a common source device to provide a sense amplifier functionality.

* * * * *